United States Patent [19]
Wu

[11] Patent Number: 6,156,613
[45] Date of Patent: Dec. 5, 2000

[54] METHOD TO FORM MOSFET WITH AN ELEVATED SOURCE/DRAIN

[75] Inventor: Shye-Lin Wu, Hsinchu, Taiwan

[73] Assignee: Texas Instruments - Acer Incorporated, Hsinchu, Taiwan

[21] Appl. No.: 09/307,630

[22] Filed: May 7, 1999

Related U.S. Application Data

[63] Continuation-in-part of application No. 09/033,526, Mar. 2, 1998, Pat. No. 5,977,561.
[51] Int. Cl.[7] .................................................. H01L 21/336
[52] U.S. Cl. ........................... 438/300; 438/306; 438/585
[58] Field of Search ..................................... 438/300, 305, 438/303, 301, 585, 306

[56] References Cited

U.S. PATENT DOCUMENTS

| | | | |
|---|---|---|---|
| 4,786,609 | 11/1988 | Chen | 438/303 |
| 4,948,745 | 8/1990 | Pfiester | 438/300 |
| 5,168,072 | 12/1992 | Moslehi | 438/300 |
| 5,354,381 | 10/1994 | Sheng | 118/723 |
| 5,530,265 | 6/1996 | Takemura | 257/66 |
| 5,683,924 | 11/1997 | Chan et al. | 438/300 |
| 5,707,883 | 1/1998 | Tabara | 438/301 |
| 5,827,768 | 10/1998 | Lin et al. | 438/300 |

OTHER PUBLICATIONS

S. Wolf et al., Silicon Processing for the VLSI Era V.1, Lattice Press: CA, pp. 539–557, Dec. 1986.
Wu et al. IEE Proc.–Circuits Devices Syst. vol. 141 No. 1 Feb. 1994.

*Primary Examiner*—Wael Fahmy
*Assistant Examiner*—Jeff Vockrodt
*Attorney, Agent, or Firm*—Harness, Dickey & Pierce, P.L.C.

[57] ABSTRACT

A gate insulator layer is formed over the semiconductor substrate and a first silicon layer is then formed over the gate insulator layer. An anti-reflection layer is formed over the first silicon layer. A gate region is defined by removing a portion of the gate insulator layer, of the first silicon layer, and of the anti-reflection layer. A doping step using low energy implantation or plasma immersion is carried out to dope the substrate to form an extended sourcedrain junction in the substrate under a region uncovered by the gate region. An undoped spacer structure is formed on sidewalls of the gate region and the anti-reflection layer is then removed. A second silicon layer is formed on the semiconductor substrate and the first silicon layer. Another doping step is performed to dope the substrate to form a source/drain junction in the substrate under a region uncovered by the gate region and the undoped spacer structure. A thermal process is performed to the semiconductor substrate, in order to diffuse and activate dopants in the extended source/drain junction and the source/drain junction.

16 Claims, 2 Drawing Sheets

METHOD TO FORM MOSFET WITH AN ELEVATED SOURCE/DRAIN

CROSS REFERENCE TO RELATED APPLICATIONS

This invention is a continuation-in-part application of U.S. Pat. No. 5,977,561 filed under the title of "ELEVATED SOURCE/DRAIN MOSFET WITH SOLID PHASE DIFFUSED SOURCE/DRAIN EXTENSION" with the Ser. No. of 09/033,526 filed at Mar. 2, 1998, which is assigned to same assignee with the same inventor as the present application.

FIELD OF THE INVENTION

The present invention relates to the manufacturing of transistors in the semiconductor fabrication, and more specifically, to a method of forming a metal oxide semiconductor field effect transistor (MOSFET) having an elevated source/drain.

BACKGROUND OF THE INVENTION

From the first invention of integrated circuits at 1960, the number of devices on a chip has grown in an explosive increasing rate. The technologies of the semiconductor industry has been researched continuously for almost four decades. The progress of the semiconductor integrated circuits has step into ULSI (ultra large scale integration) level or even higher level. The capacity of a single semiconductor chip increases from several thousand devices to hundreds of million devices, or even billions of devices. The integrated circuits devices like the transistors, the capacitors, and the connections must be greatly narrowed simultaneously. The increasing packing density of the integrated circuits generates numerous challenges to the semiconductor manufacturing process. Every device needs to be formed within smaller size without damaging the characteristics and the operations. The demands on high packing density, low heat generation, and low power consumption devices with good reliability and long operation life must be maintained without any degradation in their functions. These achievements are expected to be reached with the five key aspects of the semiconductor manufacturing, including the photography, the etching, the deposition the ion implantation, and the thermal processing technologies. The continuous increase in the packing density of the integration circuits must be accompanied with a smaller feature size. With the present semiconductor manufacturing technology, the processes with generally a quarter micrometer in size is widely utilized. For making the next generation devices, the technologies focusing mainly on one-tenth micrometer and even nanometer feature sizes are highly required.

Transistors, or more particularly the metal oxide semiconductor field effect transistors (MOSFET), are the most important and frequently employed devices. The MOSFET is widely employed in the integrated circuits with it's high performance. However, with the continuous narrowing of the device size, the sub-micron scale MOS transistors have to face many risky challenges. As the MOS transistors become narrower and thinner accompanying with shorter channels, the problems like the junction punchthrough, the leakage, and the contact resistance cause the reduction in the yield and the reliability of the semiconductor manufacturing processes.

For developing future MOS devices with a sub-micrometer or even smaller feature size, the ultra shallow junctions are required to suppress the short channel effects encountered with the down scaling sizes. On the other hand, new challenges arise with a narrowed size. The preparation of an extremely shallow source/drain junction is much harder. The conventional ion implantation process is unable to form a shallow junction with high dopant concentration. In the work proposed by K. Takeuchi et al. ("High performance sub-tenth micron CMOS using advanced boron doping and $WSi_2$ dual gate process", in 1995 Symposium on VLSI Technology Digest of Technical Papers), the problem is addressed. The ion implantation is hard to form shallow and high concentration source/drain. The defect-induced anomalous diffusion of boron in the channel region becomes a problem. Local boron depletion near the source/drain junctions will directly enhance short channel effects. A CMOS fabrication method is also disclosed in their work.

In addition, a device degradation problem is found to come from the boron penetration into the thin gate oxide with the formation of a doped polysilicon gate. S. L. Wu (the inventor of the present invention), C. L. Lee , and T. F. Lai submit the problem in their work "Suppression of Boron Penetration into an Ultra-Thin Gate Oxide ($\leq 7$ nm) by Using a Stacked-Amorphous-Silicon (SAS) Film" (IEDM 93-329 1993 IEEE). The p+ polysilicon has been widely used as the gate material of pMOSFET to avoid the short-channel effects. The $BF_2$-implant is typically used in forming both the gate and the junction. However, the F-incorporation will enhance the boron penetration through the thin gate oxide into the silicon substrate. The penetration also results in a large threshold voltage shift. A SAS gate structure is proposed to suppress the F-incorporation-induced boron penetration effect in their work.

SUMMARY OF THE INVENTION

A method of forming a metal oxide semiconductor field effect transistor (MOSFET) with an elevated sourcedrain is provided in the present invention. The short channel effects can be suppressed with the elevated junction. An extended ultra-shallow source/drain junction is formed by a plasma immersion process or a low energy implantation. The effects accompanying with the small feature size devices are eliminated by the extended ultra-shallow junction.

The method of the present invention in forming a transistor, more specifically a MOSFET, on a semiconductor substrate includes the following steps. A gate insulator layer is formed over the semiconductor substrate and a first silicon layer is then formed over the gate insulator layer. An anti-reflection layer is formed over the first silicon layer. A gate region is defined by removing a portion of the gate insulator layer, of the first silicon layer, and of the anti-reflection layer. A doping step using low energy implantation or plasma immersion is carried out to dope the substrate to form an extended source/drain junction in the substrate under a region uncovered by the gate region. An undoped spacer structure is formed on sidewalls of the gate region and the anti-reflection layer is then removed. A second silicon layer is formed on the semiconductor substrate and the first silicon layer. Another doping step is performed to dope the substrate to form a source/drain junction in the substrate under a region uncovered by the gate region and the undoped spacer structure. A thermal process is performed to the semiconductor substrate, in order to diffuse and activate dopants in the extended source/drain junction and the source/drain junction.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

A method of forming a metal oxide semiconductor field effect transistor (MOSFET) having an elevated sourcedrain is provided in the present invention. The elevated source/drain junction is formed through the deposition of a second silicon layer. The short channel effect is suppressed by using the elevated junction. A stacked silicon layer structure is utilized as the gate structure. An extended ultra-shallow source/drain junction is formed by using a plasma immersion process or a low energy implantation. The hot electron effect is eliminated by the extended ultra-shallow junction.

Figure 1:
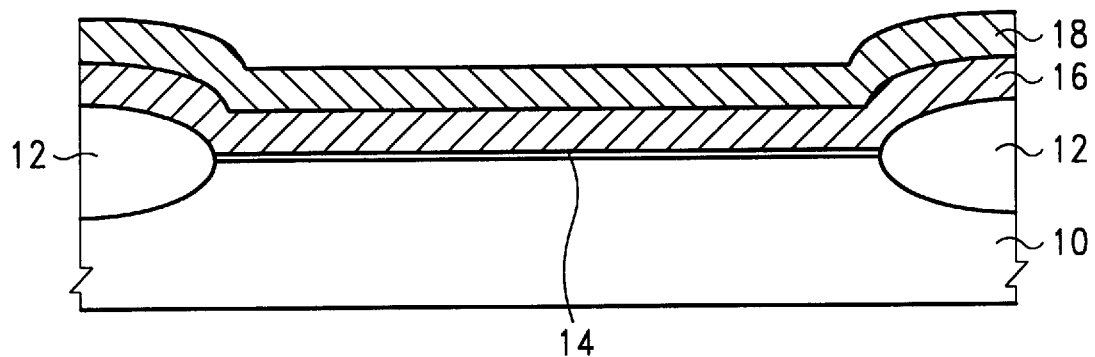
FIG. 1 illustrates a cross sectional view of the formation of a gate insulator layer, a first silicon layer, and an anti-reflection layer over the semiconductor substrate in accordance with the present invention.

The method and the steps in the present invention applied on a semiconductor wafer can create different types of transistors and numerous devices at a time. For a clear illustration, the steps for forming mainly a single MOS transistor are illustrated. Since the variations in the processes for incorporating the formation of the other types of transistors are well known in the art, the details are not described. Referring to FIG. 1, a semiconductor substrate 10 with a preferable single crystalline silicon in a <100> direction is provided. An isolation region using field oxide isolation 12 or other isolation technology like trench isolation (not shown) is formed on the semiconductor substrate 10. A gate insulator layer 14, like an oxide layer is formed. The oxide layer 14 can be grown thermally in an oxygen containing ambient. The oxide layer 14 is grown from the semiconductor substrate 10 with a thickness ranging from about 15 angstroms to 300 angstroms.

A first silicon layer 16 is then formed over the oxide layer 14. Preferably, an undoped polysilicon layer or a lightly-doped polysilicon layer can be deposited as the first silicon layer 16. The undoped or lightly-doped polysilicon layer 16 can be formed by chemical vapor deposition with a thickness of about 300 angstroms to 2000 angstroms, and with in-situ doped dopants in the case for forming a lightly-doped polysilicon. The formation of the undoped or lightly-doped polysilicon layer 16 subsequently over the oxide layer 14 can eliminates the problem of the oxide degradation from the penetration of ions.

An anti-reflection layer 18 is formed over the polysilicon layer 16. The anti-reflection layer 18 effectively reduces the unwanted reflections in the lithography process and increases the accuracy of the pattern transfer. One choice of the anti-reflection layer 18 is an nitride layer formed by a chemical vapor deposition process. The anti-reflection characteristic of the nitride layer 18 is nominated in the work of T. P. Ong et al. ("CVD SiNx Anti-reflective Coating for Sub-0.5 µm Lithography", 1995 Symposium on VLSI Technology Digest of Technical Papers") The integration of a LPCVD (low pressure chemical vapor deposition) silicon-rich nitride film as a bottom anti-reflective coating (BARC) is recommended in their work. Their integration has been successfully demonstrated for deep-UV lithography with the details proposed in the article.

Figure 2:
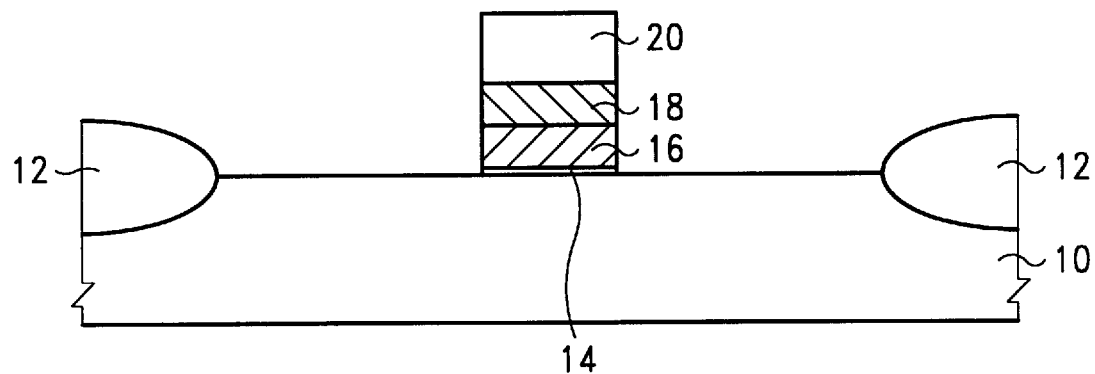
FIG. 2 illustrates a cross sectional view of defining a gate region over the semiconductor substrate in accordance with the present invention.

A gate region is formed by a series steps to remove a portion of the oxide layer 14, of the polysilicon layer 16, and of the nitride layer 18, as shown in FIG. 2. A lithography and an etching process can be applied in doing the work. A photoresist layer 20 is formed and patterned for defining a gate pattern. The oxide layer 14, the polysilicon layer 16, and the nitride layer 18 can be sequentially removed with a reactive ion etching (RIE) under the generation of plasma, using the gate pattern as a mask. The photoresist layer 20 is then removed after the gate region is defined.

Figure 3:
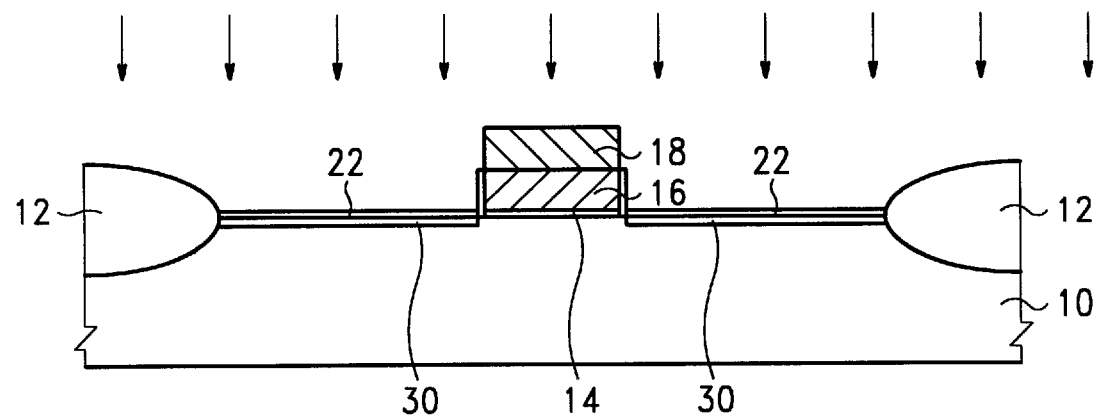
FIG. 3 illustrates a cross sectional view of doping the substrate to form an extended source/drain junction in accordance with the present invention.

Next, a doping step is carried out to dope the substrate 10 to form an extended source/drain junction 30 in the substrate 10 under a region uncovered by the gate region, as shown in FIG. 3. For forming an ultra-shallow extended source drain junction, a low energy implantation or a plasma immersion process is preferably employed in the case. The plasma immersion process can be performed in a plasma environment with the presence of phosphorus or arsenic ions in the case of forming nMOSFETs, or boron ions in the case of forming pMOSFETs. The low energy implantation process can be performed by implanting phosphorus or arsenic ions at an energy between about 0.1 to 5 KeV, preferably for having a dosage of about 1E13 to 1E15 ions/cm$^2$. Alternatively, boron ions can employed to replace phosphorus or arsenic ions in the methods mentioned above to fabricate pMOSFETs.

After the extended source/drain junction is formed, an optional step of thermally growing a dielectric layer 22 from the substrate is preferably performed. In the case, an oxynitride or oxide film thermally grown from the semiconductor substrate 10 and the undoped polysilicon layer 16, in an oxygen andor nitrogen containing gas ambient, like a $O_2$, $N_2O$ or NO ambient, is utilized as the dielectric layer 22. The oxynitride or oxide film 22 is also grown on the sidewalls of the oxide layer 14 by the diffusion of silicon through the oxide layer 14 from the semiconductor substrate 10. The thin oxynitride or oxide film can be grown with a ultra-thin thickness between about 5 angstroms to 100 angstroms. The formation of the oxynitride or oxide film 22 by consuming surface silicon material recovers the etching damage on the surface of the semiconductor substrate 10.

Figure 4:
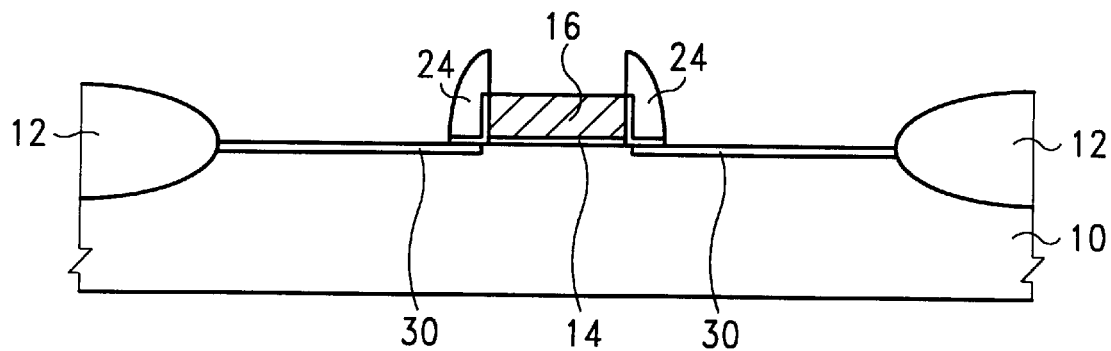
FIG. 4 illustrates a cross sectional view of the formation of a spacer structure on the gate region and the removal of the anti-reflection layer in accordance with the present invention.

Turning to FIG. 4, an undoped spacer structure 24 is formed on sidewalls of the gate region. A series of steps can be employed in forming the undoped spacer structure 24 on the gate region. In the present embodiment, silicon oxide spacers can be formed by sequentially depositing and etching back a silicon oxide layer. After the formation of the silicon oxide spacers, the anti-reflection layer 18 is removed, as shown in FIG. 4. After the removal of the anti-reflection layer 18, a doping step can be preferably carried out to dope the polysilicon layer 16 to increase the conductivity. The doping step can also be skipped and the dopants can be diffused into the polysilicon layer 16 through implantation and accompanying thermal processes.

Figure 5:
FIG. 5 illustrates a cross sectional view of forming a second silicon layer over the semiconductor substrate and the first silicon layer in accordance with the present invention.
Figure 5:
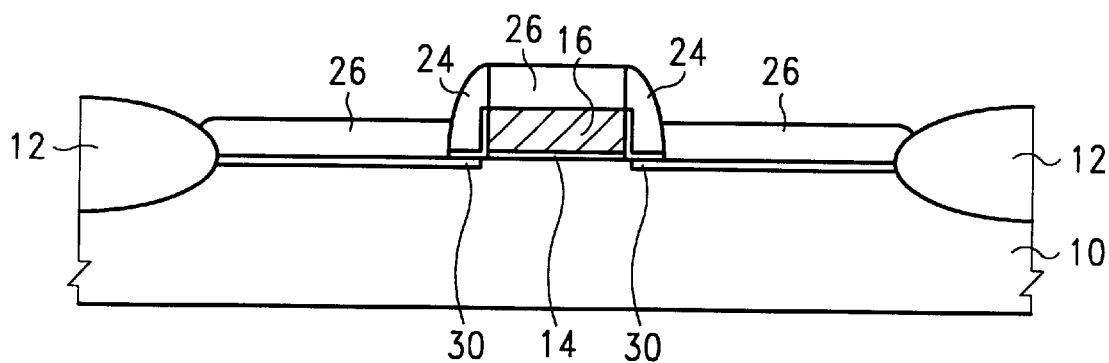

Referring to FIG. 5 a second silicon layer 26 is then formed over the semiconductor substrate 10 and the polysilicon layer 16. The second silicon layer 26 is an undoped polysilicon layer in the case, and is formed with selective epitaxial silicon process, which is performed with a chemical vapor deposition (CVD) process in an ultra high vacuum environment. Another doping step is performed to dope the second silicon layer 26, in order to form to form a source/drain junction in the substrate 10 under a region uncovered by the gate region and the undoped spacer structure, when the dopants are diffused downward in a later step. The doping step can be performed by an ion implantation process. In the case of forming nMOSFETs, the ion implantation process can be performed by implanting phosphorus or arsenic ions at an energy between about 10 to 150 KeV, preferably for having a dosage of about 5E14 to 5E16 ions/$cm^2$ in the source/drain junction after the dopants are diffused. Alternatively, boron ions can employed to replace phosphorus or arsenic ions in the method mentioned above, in order to fabricate pMOSFETs.

Figure 6:
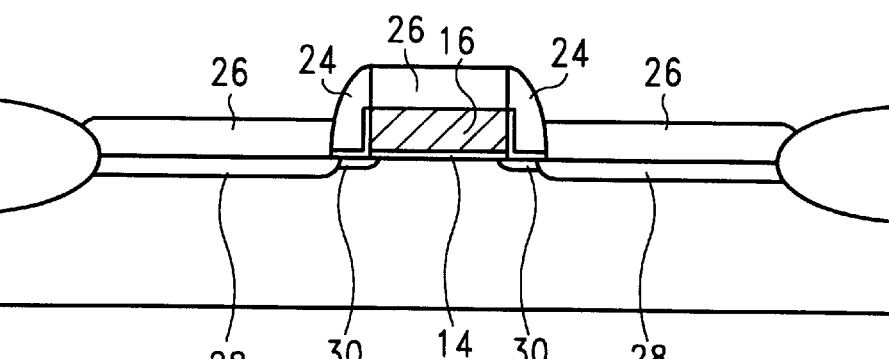
FIG. 6 illustrates a cross sectional view of performing a thermal process to diffuse and activate the dopants in accordance with the present invention.

Turning to FIG. 6, a thermal process is performed to the semiconductor substrate 10, in order to further diffuse the dopants in the second silicon layer 26 and the substrate for forming the source/drain junction 28, and also to activate dopants in the extended source/drain junction 30 and the source/drain junction 28. Therefore, the ultra-shallow source/drain junction 28 and the extended source/drain junction 30 are formed, as shown in FIG. 6.

A MOSFET having an elevated source/drain and solid phase diffused source/drain extension is formed by the method provided in the present invention. The elevated source/drain junction is formed with an ultra-shallow dimension and uniformity in size by employing the implantation through the second polysilicon layer. The short channel effects is greatly suppressed by using the elevated shallow junction. A stacked silicon layer structure is utilized as the gate structure to solve the problem of the degradation of the gate oxide. Thus the operational characteristics of the devices can be raised. An extended ultra-shallow source/drain junction is formed by using the plasma immersion process or the low energy implantation. The unwanted effects accompanying with the narrowed channel region of the small size devices are eliminated by the extended ultra-shallow junction.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming a transistor over a semiconductor substrate, said method comprising the steps of:

forming a gate insulator layer over said semiconductor substrate;

forming a first silicon layer over said gate insulator layer;

forming an anti-reflection layer over said first silicon layer;

forming a photoresist layer over said anti-reflection layer;

defining a gate pattern on said photoresist layer;

performing a reactive ion etching (RIE) using said gate pattern as a mask, to remove said portion of gate insulator layer, of said first silicon layer, and of said anti-reflection layer to define said gate region;

removing said photoresist layer;

doping said substrate with an energy between about 0.1 to 5 KeV to form an ultra-shallow extended source/drain junction in said substrate under a region uncovered by said gate region;

forming an undoped spacer structure on sidewalls of said gate region;

removing said anti-reflection layer;

forming a second silicon layer on said semiconductor substrate and said first silicon layer;

doping said second silicon layer to form a source/drain junction in said substrate under a region uncovered by said gate region and said undoped spacer structure; and performing a thermal process to said semiconductor substrate, in order to diffuse and active dopants in said extended source/drain junction and said source/drain junction.

2. The method of claim 1, wherein said semiconductor substrate comprises a silicon substrate.

3. The method of claim 1, wherein said gate insulator layer comprises a silicon oxide layer which is thermally grown in an oxygen containing ambient from said semiconductor substrate with a thickness of about 15 angstroms to 300 angstroms.

4. The method of claim 1, wherein said first silicon layer comprises an undoped polysilicon layer deposited with a thickness of about 300 angstroms to 2000 angstroms.

5. The method of claim 1, wherein said first silicon layer comprises an doped polysilicon layer deposited with a thickness of about 300 angstroms to 2000 angstroms.

6. The method of claim 1, wherein said anti-reflection layer comprises an nitride layer formed by deposition.

7. The method of claim 1, wherein said undoped spacer structure comprises silicon oxide spacers.

8. The method of claim 1 further comprises the steps of doping said first silicon layer after the step of removing said anti-reflection layer.

9. The method of claim 1, wherein said second silicon layer is deposited with a selective epitaxial process.

10. The method of claim 1, wherein said doping step for forming said extended source/drain junction is performed with a plasma immersion process.

11. The method of claim 1 further comprises the step of thermally growing a dielectric layer on said substrate and sidewalls of the first silicon layer after said doping step for forming said extended source/drain regions is performed.

12. A method of forming a transistor over a semiconductor substrate, said method comprising the steps of:

forming a gate insulator layer over said semiconductor substrate;

forming a first silicon layer over said gate insulator layer;

forming an anti-reflection layer over said first silicon layer;

forming a photoresist layer over said anti-reflection layer;

defining a gate pattern on said photoresist layer;

performing a reactive ion etching (RIE) using said gate pattern as a mask, to remove said portion of gate insulator layer, of said first silicon layer, and of said anti-reflection layer to define said gate region;

removing said photoresist layer;

doping said substrate with an energy between about 0.1 to 5 KeV to form an ultra-shallow extended source/drain junction in said substrate under a region uncovered by said gate region;

thermally growing a dielectric layer on said substrate, sidewalls of said gate insulator layer and sidewalls of said first silicon layer;

forming an undoped spacer structure of silicon oxide spacers on sidewalls of said gate region;

removing said anti-reflection layer;

forming a second silicon layer on said semiconductor substrate and said first silicon layer;

doping said second silicon layer to form a source/drain junction in said substrate under a region uncovered by said gate region and said undoped spacer structure; and performing a thermal process to said semiconductor substrate, in order to diffuse and activate dopants in said extended source/drain junction and said source/drain junction.

13. The method of claim 12, further comprises the steps of doping said first silicon layer after the step of removing said anti-reflection layer.

14. The method of claim 12, wherein said second silicon layer is deposited with a selective epitaxial process.

15. The method of claim 12, wherein said doping step for forming said extended source/drain junction is performed with a plasma immersion process.

16. The method of claim 12, wherein said doping step for forming said extended source/drain regions is performed with a low energy ion implantation process with an energy between about 0.1 to 5 KeV.

* * * * *